United States Patent [19]

Patrigeon et al.

[11] Patent Number: 5,141,775
[45] Date of Patent: Aug. 25, 1992

[54] METHOD FOR THE MANUFACTURE OF A COMPOSITE MATERIAL PART

[75] Inventors: Yves Patrigeon, Bordeaux Cauderan; Michel Vives, Eysines; Denis Sabaca, Merignac, all of France

[73] Assignee: Societe Europeenne de Propulsion, Suresnes, France

[21] Appl. No.: 620,157

[22] Filed: Nov. 29, 1990

[30] Foreign Application Priority Data

Dec. 1, 1989 [FR] France .................. 89 15929

[51] Int. Cl.⁵ .............................. C23C 16/26
[52] U.S. Cl. .................. 427/249; 156/242; 156/288; 156/289; 156/323; 264/81; 264/257; 427/255
[58] Field of Search ............ 264/29.1, 29.5, 81, 264/82, 136, 257, 258; 427/248.1, 249, 255, 255.2, 255.3; 156/87, 89, 242, 288, 289, 323

[56] References Cited

U.S. PATENT DOCUMENTS

| | | | |
|---|---|---|---|
| 3,895,084 | 7/1975 | Bauer | 264/81 |
| 3,917,782 | 11/1975 | Holcombe et al. | 264/81 |
| 3,991,248 | 11/1976 | Bauer | 428/245 |
| 4,178,413 | 12/1979 | De Munda | 427/249 |
| 4,291,794 | 9/1981 | Bauer | 264/29.4 |
| 4,318,948 | 3/1982 | Hodgson | 264/81 |
| 4,353,964 | 10/1982 | Grimm et al. | 264/81 |
| 4,460,529 | 7/1984 | Schultze et al. | 264/81 |
| 4,613,522 | 9/1986 | Vasilos | 264/29.5 |
| 4,668,729 | 5/1987 | Kataoka | 156/323 |
| 4,752,503 | 6/1988 | Thebault | 427/255 |
| 4,790,052 | 12/1988 | Olry | 28/143 |
| 4,894,286 | 1/1990 | Gray | 427/402 |
| 4,895,108 | 1/1990 | Caputo et al. | 264/81 |
| 4,963,393 | 10/1990 | Goela et al. | 427/249 |
| 4,997,678 | 3/1991 | Taylor et al. | 427/249 |
| 5,034,172 | 7/1991 | Vives et al. | 427/249 |

FOREIGN PATENT DOCUMENTS

| | | |
|---|---|---|
| 2401888 | 3/1979 | France . |
| 2565262 | 9/1986 | France . |
| 2587992 | 4/1987 | France . |
| 436092 | 11/1967 | Switzerland . |
| 2028230 | 3/1980 | United Kingdom . |

Primary Examiner—Jay H. Woo
Assistant Examiner—Robert B. Davis
Attorney, Agent, or Firm—Weingarten, Schurgin, Gagnebin & Hayes

[57] ABSTRACT

The invention relates to the manufacture of a composite material part by shaping a fibrous reinforcement texture and densifying the texture by chemical vapor infiltration of the material constituting the matrix of the composite through the porosity of the texture. Before densification, the texture is separated from an adjacent structure, such as an adjacent surface of a tool (12, 14) inside which the texture is held, or another texture, by means of an inserted layer (10) of fabric produced in a refractory material having a thermal expansion coefficient different from that of the constituent material of the texture.

6 Claims, 2 Drawing Sheets

METHOD FOR THE MANUFACTURE OF A COMPOSITE MATERIAL PART

FIELD OF THE INVENTION

The present invention relates to a method for the manufacture of a composite material part comprising a fibrous reinforcement texture densified by a matrix.

The invention relates more particularly to a method of the type comprising the steps of shaping the fibrous reinforcement texture, and of densifying the texture by chemical vapor infiltration.

BACKGROUND OF THE INVENTION

Such a method is used for manufacturing parts in thermostructural composite materials, e.g. materials capable of constituting structural elements and of retaining their mechanical properties at high temperatures.

Examples of thermostructural composite materials are the carbon-carbon (C-C) type composites and the ceramic matrix composites (CMC).

In a C-C type composite, the reinforcement texture is in carbon fibers and is densified by carbon, while in a CMC-type composite, the reinforcement texture is in refractory fibers (carbon or ceramic fibers) and is densified by a ceramic matrix.

When the thermostructural composite material parts are produced by chemical vapor infiltration of the material constituting the matrix, through the accessible porosity of the reinforcement texture, the shape of said texture is generally maintained by means of a tool, normally in graphite.

A problem which has been arising for a long time is that of releasing the densified part from the tool, because of the adherence to said tool. Said adherence is due to the material constituting the matrix which is deposited through the porosity of the reinforcement texture and also on the surface of the tool.

A number of solutions have been proposed for reducing the adherence to the tool, notably by treating the surface of the latter.

However, the conventional solutions have proved to have limited efficiency, particularly in the case of three-dimensional (3D) type fibrous reinforcement textures. Compared with the two-dimensional (2D) type textures in which the fibers extend in parallel to the faces of the texture, the 3 D textures contain fibers which extend in directions forming a non-zero angle with respect to the faces of the texture. Said fibers, which issue onto each face of the texture, offer multiple points of contact with the tool, thus helping adherence. The adherence is all the stronger as the surface of the texture is bulging with fibers.

SUMMARY OF THE INVENTION

It is therefore the object of the invention to provide a method enabling ready release of the parts obtained after densification by chemical vapor infiltration of a fibrous texture inside a tool, even when the texture is a 3 D type texture.

Another object of the invention is to provide a method enabling simultaneous densification of several textures stacked inside the same tool.

This object is attained with a method of the type described at the beginning of the present description, whereby, according to the invention, the reinforcement texture is separated, before densification, from at least one adjacent structure, by an inserted layer of cloth made from a refractory material having a thermal expansion coefficient different from that of the constituent material of the texture.

The inserted layer is preferably a layer of fabric, such as satin or a woven cloth, the aim of which is to reduce to a minimum the contact points between the texture and the adjacent structure, namely the tool or another texture.

The combined effect of reduction of the contact points and of the differential expansion between the texture and the inserted layer causes, during the cooling phase following the infiltration, natural splitting of the matrix at the level of the texture-inserted layer interface areas.

The use of inserted layers enables the simultaneous densification of a plurality of textures superposed in the same tool. To this effect, the adjacent textures are separated from one another by an inserted layer, each of the external faces of the superposed textures being, if appropriate, separated from the tool by an inserted layer.

BRIEF DESCRIPTION OF THE DRAWINGS

The invention will be more readily understood on reading the following description with reference to the accompanying drawings in which.

DETAILED DESCRIPTION OF THE PREFERRED EMBODIMENTS

The following description is given with reference to the manufacture of C-C or CMC composite material parts, this being the preferred field of application of the invention.

As conventionally known, said parts are produced by the steps of forming a fibrous reinforcement texture 10 (or preform), placing the texture inside a tool comprising a header die 12 and a bottom die 14 and densifying the fibrous texture by chemical vapor infiltration of the matrix constituent material. Such methods are described for example in document U.S. Pat. No. 3,895,084 for manufacturing parts in C-C composite material, and in document FR-A-2 401 888 for manufacturing parts in CMC.

The texture 10 is composed of refractory fibers such as carbon fibers and ceramic fibers (silicon carbide, boron nitride, alumina, zirconia, . . .).

The texture 10 is for example formed by stacking two-dimensional layers, such as layers of cloth, which are held between the header die 12 and the bottom die 14 while being compressed so as to obtain in the texture to be densified, the required density rate of fibers.

The stacked layers may be bound to one another by means of fibers forming a non-zero angle with respect to the faces of the texture.

Figure 3:
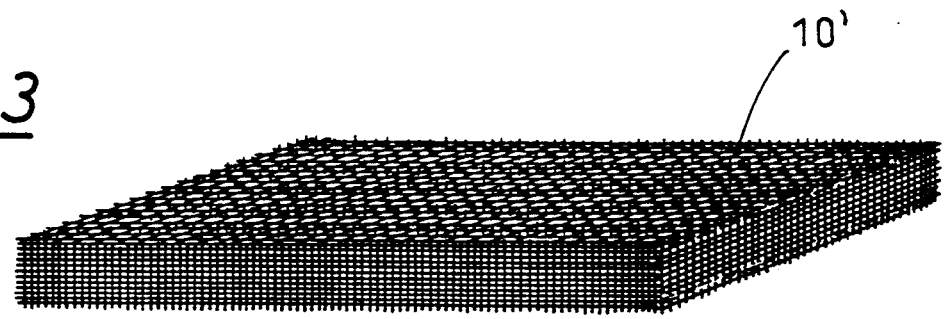
FIGS. 3 and 4 illustrate very diagrammatically reinforcement textures usable in carrying out the method according to the invention.

FIG. 3, for example, shows a texture 10' with yarns implanted perpendicularly to the stacked layers, the implantation being achieved for example according to the method described in document FR-A-2 565 262.

Figure 4:
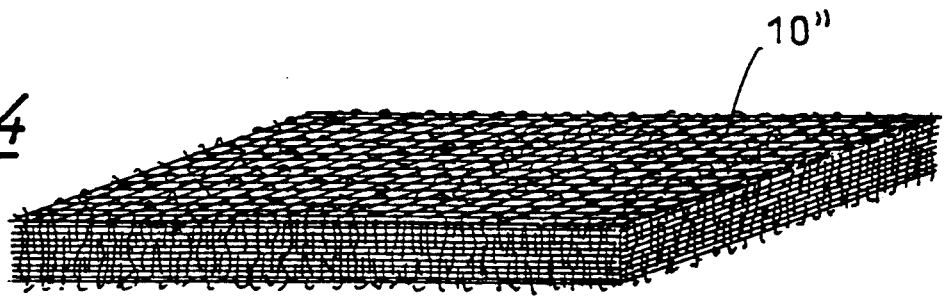

FIG. 4 illustrates another texture 10" in which the layers of fabric are bound to one another by fibers traversing the layers after needling of a web of fibers. In the case of a texture in carbon fibers, the web of fibers is for example composed of fibers in preoxidized polyacrylonitrile (PAN) which is a carbon precursor, said fibers thereafter undergoing a carbonization process.

The tool in which the reinforcement texture is placed is generally in graphite. The header die 12 and the bottom die 14 are perforated with a plurality of holes for easy access of the gaseous infiltration phase to the texture to be densified. Said gaseous phase is selected as a function of the nature of the material constituting the matrix (carbon or ceramic such as silicon carbide, boron nitride, . . . ). An intermediate coating in pyrolytic carbon or boron nitride may be applied on the fibers before infiltration of the matrix, as described in U.S. Pat. No. 4,752,503. It is moreover possible to produce a matrix with several phases, all formed by successive deposits of different materials.

In the illustrated example, the header die 12 and the bottom die 14 are shaped as simple plates. But obviously, the tool can have any other form, such as with incurved plates, depending on the shape of the part to be produced.

The header die 12 and the bottom die 14 are joined together by tie rods 16 for compressing the texture. Cross-pieces 18 defining the thickness of the texture to be densified may be inserted between the header die and the bottom die.

When densification is performed with a direct contact between the texture and the tool, problems arise for releasing the part due to the texture adhering to the tool, particularly when the texture has fibers projecting from or bulging on its faces, as is the case with the textures according to FIGS. 3 and 4.

To solve this problem, an inserted layer 20 is placed between the texture and each face of the tool adjacent to the texture.

The inserted layer 20 (FIGS. 1 and 2) is advantageously constituted by a layer of cloth, and is made from a material having a thermal expansion coefficient different from that of the material constituting the texture. The densification by chemical vapor infiltration being carried out at a relatively high temperature, the difference of expansions causes, during the cooling phase which follows the infiltration, splitting to occur at the level of the texture-inserted layer interface areas which are infiltrated through by the matrix.

Accordingly, when the texture to be densified is in carbon, an inserted layer of a cloth of refractory fibers other than carbon can be used, such as for example a cloth in silicon carbide, and when the texture to be densified is in ceramic or any other refractory material different from carbon, then an inserted layer of a cloth in carbon fibers will be used.

Due to the presence of the inserted layer 20, all contact between the fibers projecting or bulging on the surface of the reinforcement texture and the tool is considerably reduced if not altogether prevented.

The use of inserted layers also makes it possible to densify more than one reinforcement textures superimposed in the same tool.

Figure 1:
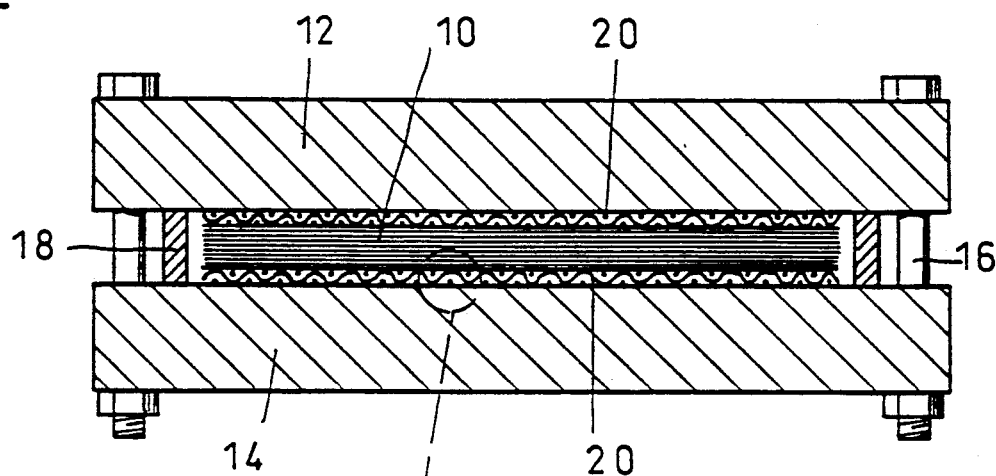
FIG. 1 illustrates very diagrammatically a fibrous reinforcement texture presented inside a tool, but being separated from said tool by two inserted layers, according to the invention.
Figure 2:
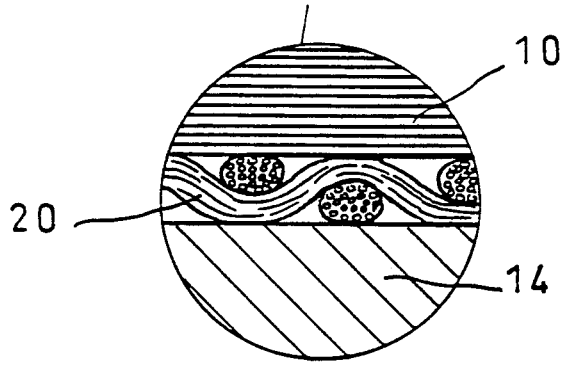
FIG. 2 is a detailed view, illustrating very diagrammatically and on an enlarged scale, adjacent areas of the tool and of the texture separated by an inserted layer.
Figure 5:
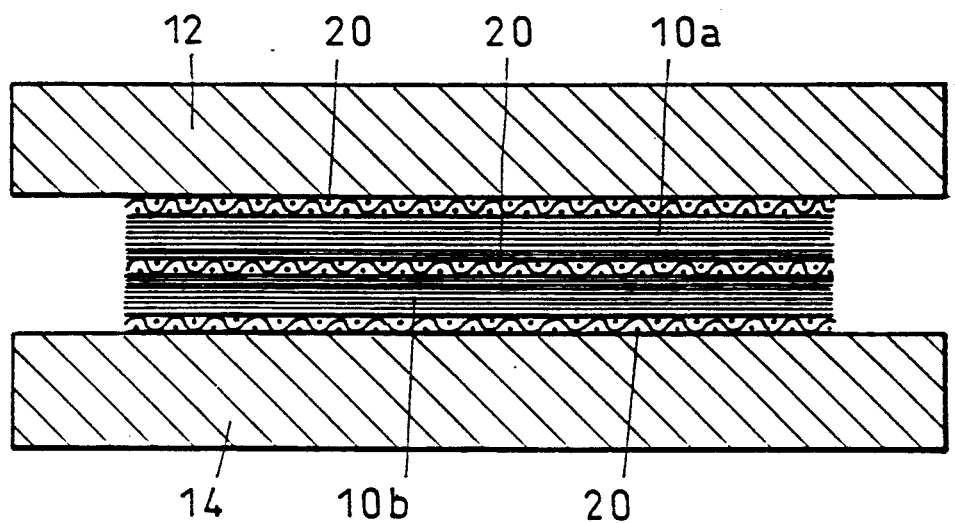
FIGS. 5 and 6 illustrate the application of the method according to the invention to the simultaneous manufacture of a plurality of parts by densification of a plurality of textures superposed inside the tool.

Referring for example to FIG. 5, this shows a tool such as that shown in FIG. 1 with a header die 12 and a bottom die 14 between which are disposed two fibrous reinforcement textures 10a and 10b having substantially identical dimensions.

Inserted layers 20 are placed between the header die 12 and the adjacent texture 10a, between the bottom die 14 and the adjacent texture 10b and between textures 10a and 10b. The inserted layer situated between the textures acts in the same way as that situated between each texture and the tool, to allow an easy release of the parts obtained after co-densification of textures 10a and 10b.

The number of textures which can be stacked in one tool is not limited to two, since adjacent textures are separated by an inserted layer.

The material constituting a layer inserted between two textures is naturally selected to have a thermal expansion coefficient different from that, or those, of the material or materials consituting the two textures.

If there is no adherence between the texture to be densified and the tool, or if the adherence is insufficient to significantly impair the operation of releasing the part from the tool, the method according to the invention can be used just for densifying a plurality of textures, simultaneously, in one tool.

Figure 6:
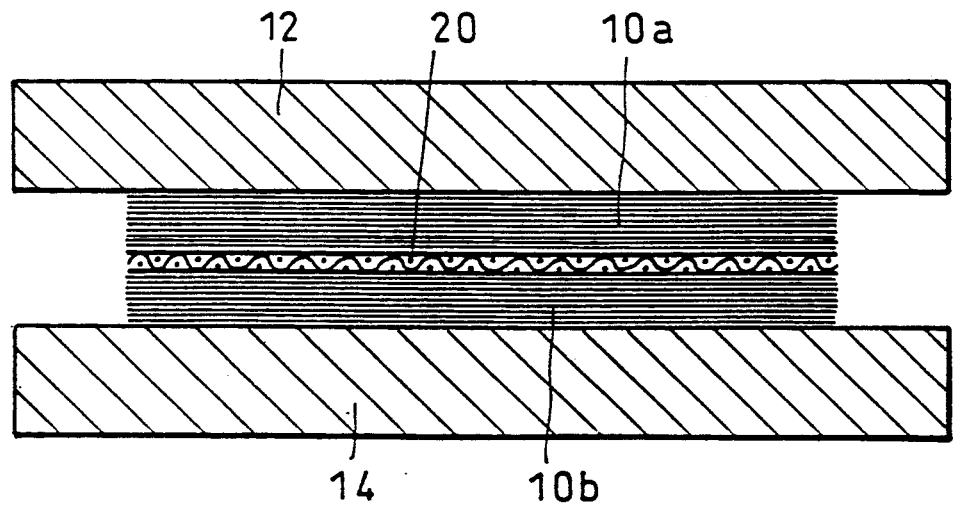

As illustrated in FIG. 6, a layer 22 is inserted between two textures 10a and 10b superposed between the header die 12 and the bottom die 14, but there is no layer inserted between the textures and the tool.

According to FIGS. 5 and 6, several pieces can be simultaneously densified with only one tool, which obviously is an advantage from the point of view of production output.

What is claimed is:

1. A method for manufacturing a composite material part containing a fibrous reinforcement texture densified by a matrix, the method comprising the steps of:
   shaping the fibrous reinforcement texture; and
   densifying the fibrous reinforcement texture by chemical vapor infiltration of the material constituting the matrix through the porosity of the fibrous reinforcement texture;
   wherein, during the step of densifying the fibrous reinforcement texture, said fibrous reinforcement texture is separated from at least one adjacent structure by an inserted layer of fabric produced from a refractory material having a thermal expansion coefficient different from the thermal expansion coefficient of the fibrous reinforcement texture.

2. The method as claimed in claim 1, wherein the fibrous reinforcement texture is densified while being held in a tool, and said inserted layer is inserted between the fibrous reinforcement texture and an adjacent surface of the tool.

3. The method as claimed in claim 1, wherein a plurality of fibrous reinforcement textures are superposed while being separated from one another by an inserted layer, and the superposed layers are simultaneously densified by chemical vapor infiltration.

4. The method as claimed in claim 1 wherein said fibrous reinforcement texture comprises carbon fibers, and the inserted layer comprises a fabric of ceramic fibers.

5. The method as claimed in claim 4, wherein the inserted layer comprises a fabric of silicon carbide fibers.

6. The method as claimed in claim 1 wherein said fibrous reinforcement texture comprises ceramic fibers, and the inserted layer comprises a fabric of carbon fibers.

* * * * *